United States Patent [19]
Hill et al.

[11] Patent Number: 6,002,128
[45] Date of Patent: Dec. 14, 1999

[54] SAMPLE ANALYZER

[75] Inventors: Rowland Hill, Buckinghamshire; Paul William Miles, Hampshire, both of United Kingdom

[73] Assignee: Ionoptika, Ltd., Southhampton, United Kingdom

[21] Appl. No.: 08/973,547

[22] PCT Filed: Jul. 2, 1996

[86] PCT No.: PCT/GB96/01592

§ 371 Date: May 4, 1998

§ 102(e) Date: May 4, 1998

[87] PCT Pub. No.: WO97/02590

PCT Pub. Date: Jan. 23, 1997

[30] Foreign Application Priority Data

Jul. 4, 1995 [GB] United Kingdom .................. 9513586

[51] Int. Cl.⁶ .............................. H01J 37/252; H01J 49/40
[52] U.S. Cl. ............................ 250/287; 250/281; 250/399
[58] Field of Search ................................... 250/287, 281, 250/309, 399

Primary Examiner—Edward P. Westin
Assistant Examiner—Nikita Wells
Attorney, Agent, or Firm—Michael de Angeli

[57] ABSTRACT

A time-of-flight secondary ion mass spectrometer instrument comprises a pulsed source of a beam of ions, directed through a focusing device onto a sample to be analyzed. Ions emitted from the sample are collected, and mass spectrometry performed thereon to analyze the sample. Both the source and emitted beams may be focused by the same focusing device. This allows the instrument to be mounted to a single port in a vacuum chamber.

14 Claims, 6 Drawing Sheets

SAMPLE ANALYZER

The present invention relates to a sample analyzer for application in surface analysis, in particular comprising a source of a primary beam of charged particles and a time of flight mass spectrometer for analysing secondary charged particles from the sample surface.

Surface Analysis is dominated by instruments designed to perform x-ray photoelectron spectroscopy (XPS). A surface illuminated with x-radiation will release photoelectrons whose kinetic energy can be analyzed using an analysing means. Such an energy analysing means may take the form of a hemispherical energy analyzer. The kinetic energies of such photoelectrons emitted from elements present in the surface of the sample can be modified or shifted by the nature of the chemical bonding between adjacent elements. Interpretation of the kinetic energy spectra therefore yields information about the way elements are bound to one another and hence the chemical composition of the surface.

A complementary technique involves the release from the surface of intact molecules or parts thereof under the action of a beam of energetic ions or neutral particles. Where the secondary particles are charged they can be collected and mass analyzed by a mass spectrometer. This technique has become known as static secondary ion mass spectrometry (S-SIMS). The word static confirms that only the surface monolayer is interrogated. Static SIMS therefore has a natural limit on the total ion dose which may be employed before the surface monolayer is removed. This is recognised to be in the range of $10^{12}$ to $10^{13}$ ions or neutrals cm-2.

Recently, static SIMS has been transformed by performing the mass spectrometry by time of flight (TOF). Thus a complete mass spectrum may, in principle, be collected for every pulse of the primary beam ensuring that the maximum amount of data is collected.

Generally, XPS and Time of Flight SIMS are undertaken on separate instruments because it is difficult to configure both techniques on a single instrument. Therefore, the analysis laboratory must bear the costs of purchasing and running two instruments or forego one of the techniques.

Moreover, the configuration of a stand-alone TOF SIMS instrument is not straightforward. The main reason for this is that the extraction field for the TOF analyzer needs to be strong (~2,000–5,000 Volts/cm) to give a good collection efficiency and mass resolution and this requirement imposes a severe constraint on the relative positions of the TOF extraction system, the sample, the primary probe and the charge neutralising means.

FIG. 1 illustrates a conventional time of flight SIMS instrument. A sample 20 to be analyzed is mounted in a vacuum chamber 21. The vacuum chamber has a number of flanges 22–24 for mounting various elements for sample analysis. An ion gun is mounted to the flange 22 and emits a primary ion beam 25 which is focused by a primary focuser comprising 3 coaxial annular electrodes 26–28 and steered in a raster pattern onto the sample by a steering element 29. A secondary beam of ions 30 is collected from the sample and focused by a secondary focuser 31–33 into a time of flight mass spectrometer mounted to the flange 23. As can be seen in FIG. 1, other components can be attached to other flanges in the vacuum chamber, such as an electron gun fitted to flange 24, and a secondary electron detector and microscope/TV camera mounted to other flanges (not shown).

As is apparent from FIG. 1, the instrument is very congested. The chamber of an X-ray Photoelectron Spectroscopy (XPS) instrument is similarly congested, with many components competing for space around the sample. In general, an XPS instrument may have one spare flange, but not sufficient flanges or internal space to add in a conventional Time of Flight SIMS facility.

An example of a known Time of Flight SIMS is described in WO 91/03070.

In accordance with a first aspect of the present invention, there is provided a time-of-flight secondary ion mass spectrometer as specified in claim 1 hereinafter.

By providing focusing means through which both the primary and secondary beams pass, the present invention provides a time of flight SIMS which can fit onto a single flange of an instrument vacuum chamber, and brings the primary beam ion source and time of flight mass spectrometer together into a compact integrated mechanical assembly. This mechanical compactness makes it a cheap and viable add-on to existing XPS instruments.

The focusing means may comprise two focusing elements (one for focusing each beam) such as sets of coaxial electrodes in close proximity. Typically however the focusing means comprises a common focusing element (such as a single set of electrodes).

In the case of separate focusers, the primary focuser (which typically comprises a set of electrodes) is switched on to focus the primary beam, then this is switched off and the other set of electrodes switched on to focus the secondary beam. In the case of a common focuser (such as a set of electrodes) the electrodes are switched between a first condition in which the primary beam is focused onto the sample, and a second condition in which the secondary beam is focused into the time-of-flight SIMS.

Typically the analyzer further comprises a steering element (such as a set of steering electrodes) which steer the primary beam onto the sample in a raster pattern, typically within a small area of the sample surface. Secondary ions ejected from the sample by a rastered primary beam can be analyzed to form a SIMS image.

When analysing the surface of insulating or semiconducting materials, primary ions are implanted in the sample, and electrons are ejected, causing the sample to acquire a positive charge. It is desirable to have a facility for irradiating the surface with low energy electrons to neutralise this charge. In this case the analyzer typically further comprises means for generating and directing electrons onto the sample in order to charge neutralise it.

The axis of the primary ion beam source may be offset by a small angle from the axis of the mass spectrometer. In this case, the system typically comprises a set of deflection plates which are switched in the time interval between the passage of the beam pulses to direct the primary or secondary beams such that they are substantially coaxial in the region of the focusing means. Typically, however, the primary beam passes through the mass spectrometer and is substantially coaxial with the secondary beam.

The mass spectrometer may comprise a multiple sector analyzer or any other suitable type of time of flight mass spectrometer. Preferably the mass spectrometer comprises an ion mirror reflectron.

The charged particles of the primary beam may be metal ions for example Gallium, Caesium, Indium, Bismuth or Gold. Alternatively, they may be ions of a gas such as Oxygen or Argon.

Typically the primary beam is finely focused for high spatial resolution.

The primary beam may also be charge neutralised after focusing to provide a neutral primary beam.

A means of post-ionisation, such as a laser beam, may be used in conjunction with the invention to increase the number of ions available for analysis for the mass spectrometer.

In accordance with a second aspect of the present invention, there is provided a time-of-flight secondary ion mass spectrometer as specified in claim 13 hereinafter.

By suitably arranging the two dimensions of the device, it is possible for the focusing means to be adapted to focus the primary and secondary beams without pulsed operation of the focusing means. In this case, the second aspect of the invention provides a device in which the steering electrodes are switched.

Typically, the second condition for the steering element is to merely allow the secondary beam to pass through the steering element (i.e. by holding the steering element at zero volts). Alternatively the steering electrodes may be used to help pick up the signal from the secondary beam, and in this case the second condition comprises a condition in which the steering element steers the secondary beam from the sample towards the mass spectrometer.

Typically the analyzer according to the second aspect of the invention further comprises focusing means through which the primary beam passes and is focused onto the sample and through which the secondary beam passes and is focused into the time-of-flight mass spectrometer.

The second aspect of the present invention has similar advantages and preferred features as the first aspect.

A number of embodiments of both aspects of the present invention will now be described and contrasted with reference to the prior art in the following figures in which:

FIG. 2 is a schematic cross-section through a first embodiment of the present invention. The reference numerals shown in this figure are repeated for the corresponding components in the following FIGS. 3–6.

Figure 1:
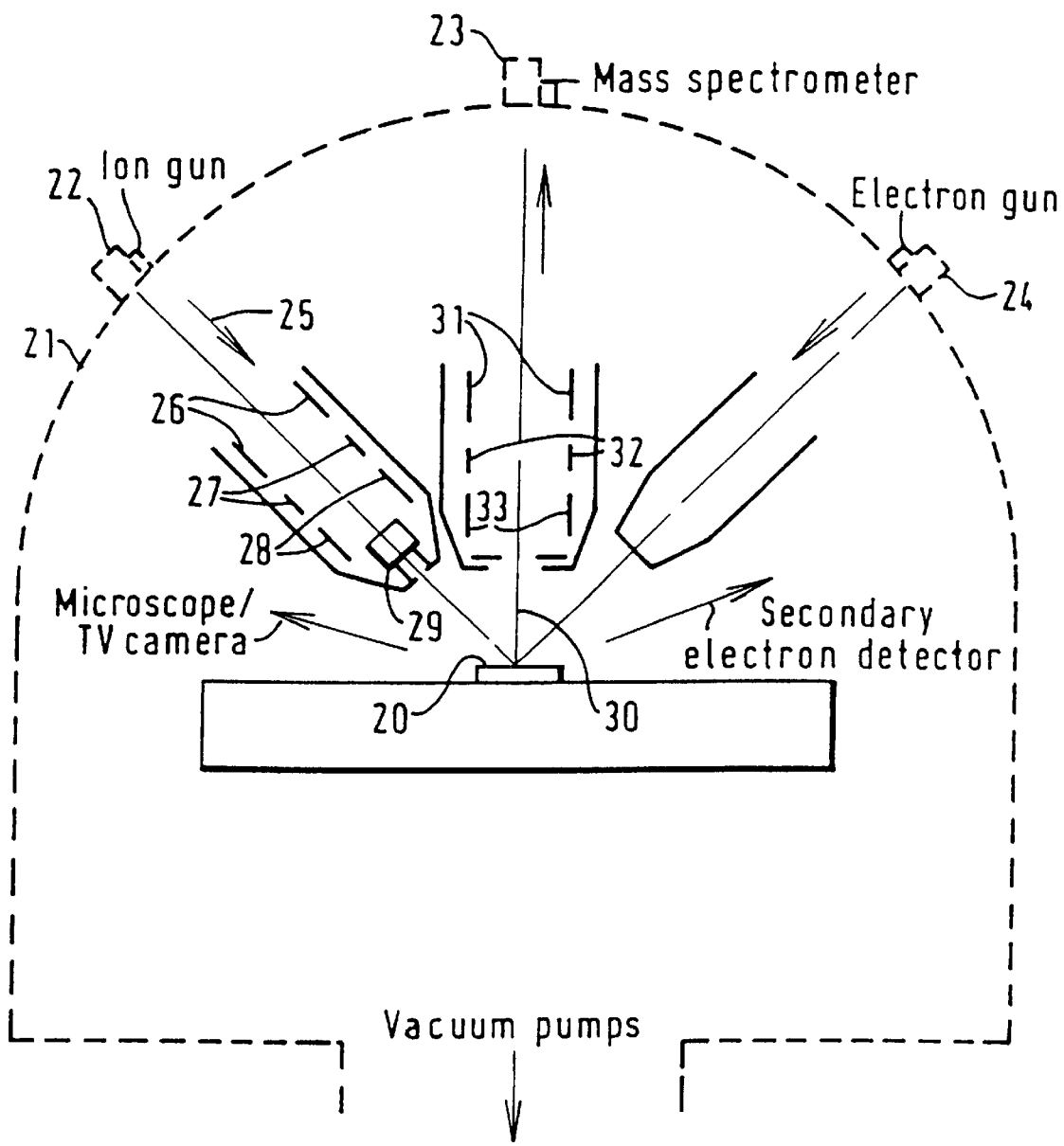
FIG. 1 illustrates a vacuum chamber of a conventional time of flight instrument.
Figure 2:
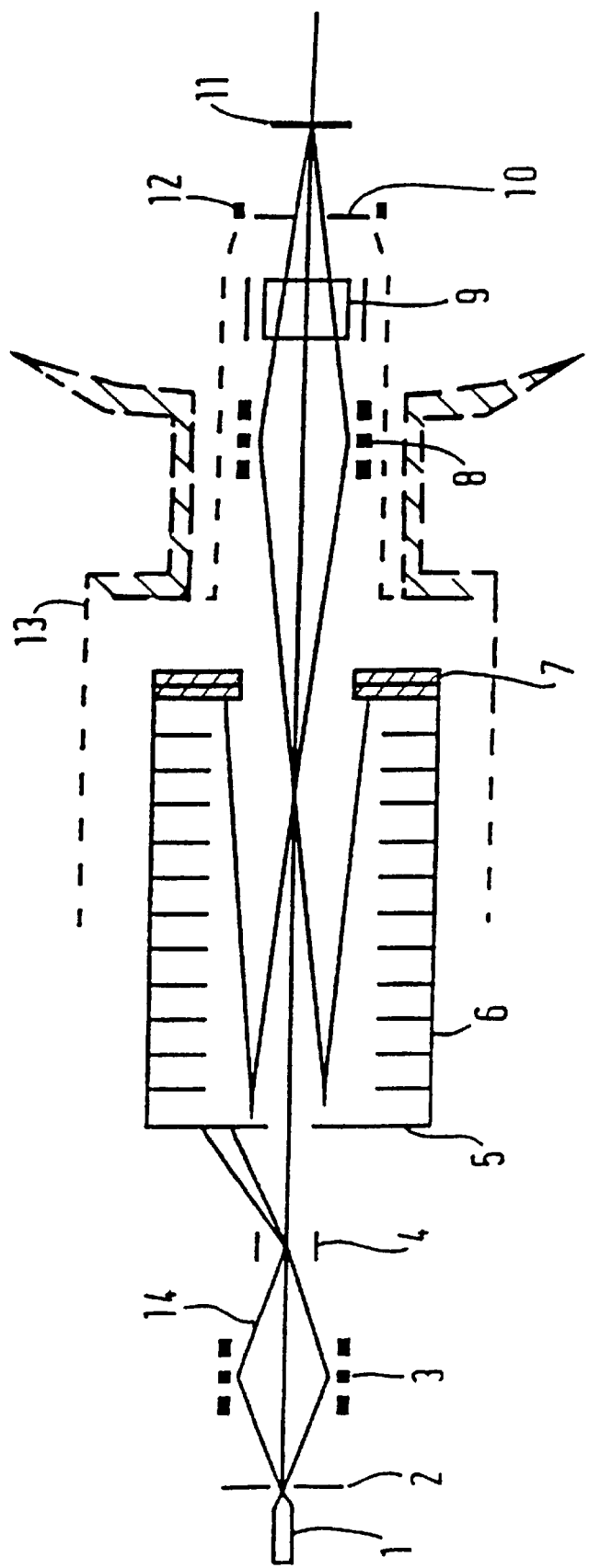
FIG. 2 is a schematic cross-section through a first embodiment of the present invention.

Referring to FIG. 2, the source of charged particles is provided by a liquid gallium ion source 1 and accelerated through its counter electrode 2. A focusing lens 3 forms a beam waist in the beam blanking electrodes 4 used to flit the beam rapidly into and out of the aperture 5 which also forms the back of an ion mirror reflectron. The pulsed beam thus formed passes down the axis of the ion mirror 6 and its detector 7 and is focused into a fine probe by a focusing lens 8. Steering electrodes 9 direct the beam onto a sample 11. At this instant, the various focusing and deflecting voltages are rapidly adjusted such that the secondary ions released from the sample are swept into the mass spectrometer by means of an electric field between the sample 11 and a collector electrode 10. The secondary ion may take either sign. Potentials on electrode structures 9,8,6 and 5 are similarly adjusted so that the secondary ions follow trajectories into the ion mirror. Here they are reflected onto the detector 7.

The steering electrodes 9 are generally only switched "ON" to steer the primary beam across the sample (and "OFF" for the secondary beam). However, the electrodes 9 may also be used to help pick up the signal from the secondary beam (i.e. they may be switched between two voltages for the primary and secondary beams).

As described above, the focuser 8 is switched during the time interval between the passing of the beams in order to focus the primary beam at a first voltage (typically between 10 and 25 kV), and focus the secondary beam at a second voltage (typically 4.5 kV). However, by suitably aligning and arranging the key dimensions of the device (in particular the distances between the focuser 8, the sample 11 and the reflectron 6), it is possible to operate the device without switched operation of the focuser 8. The primary beam is typically accelerated by a voltage of 15 kV, and the secondary beam is typically accelerated by a lower voltage, typically 4.5 kV. As a result, the focusing properties of the focuser 8 (which depends upon the energy of the particles being focused) vary between the primary and secondary beams and by suitable positioning, the focuser 8 can be made to bring the primary and secondary beams to the correct focusing points without having to switch between the two voltages for the focusing electrodes.

An electron source 12 is provided as a source of a flood of low energy electrons for charge neutralisation of the sample 11. Means (not shown) for applying a potential to the sample holder is also provided. The potential applied to the sample holder and/or the collector electrode 10 may temporarily be brought to zero to present a minimum deflecting field to the low energy electron beam.

The typical position of a flange connection between the housing of the device and the instruments chamber is indicated at 13. As can be seen, the entire device can be mounted on a single flange.

Figure 3:
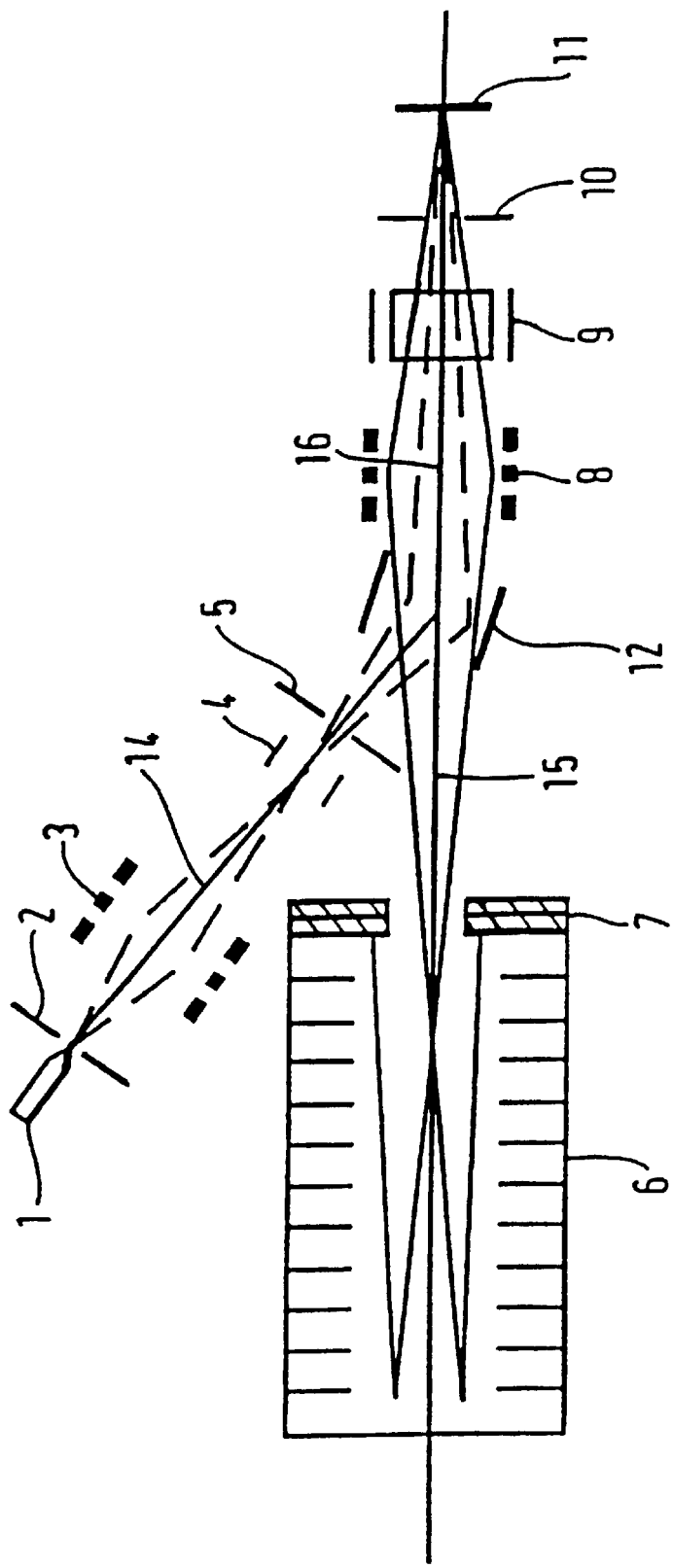
FIG. 3 is a schematic cross-section of a second embodiment with the primary beam deflected into the mutual axis.

FIG. 3 is a schematic cross-section of a second embodiment of the present invention. In this case, the axis 14 of the primary ion beam is offset by a small angle (exaggerated in the drawing) from the axis 15 of the secondary beam. An aperture 5 is again provided for the primary beam, but in this case is no longer the back of the reflectron 6. Deflection plates 12 are switched on to deflect the primary beam onto the axis 16 of the focuser 8, but are switched off for the secondary beam. The flange 13 is omitted from FIG. 3, but as can be seen with reference to FIG. 2, this device can also be mounted to a single flange.

Figure 4:
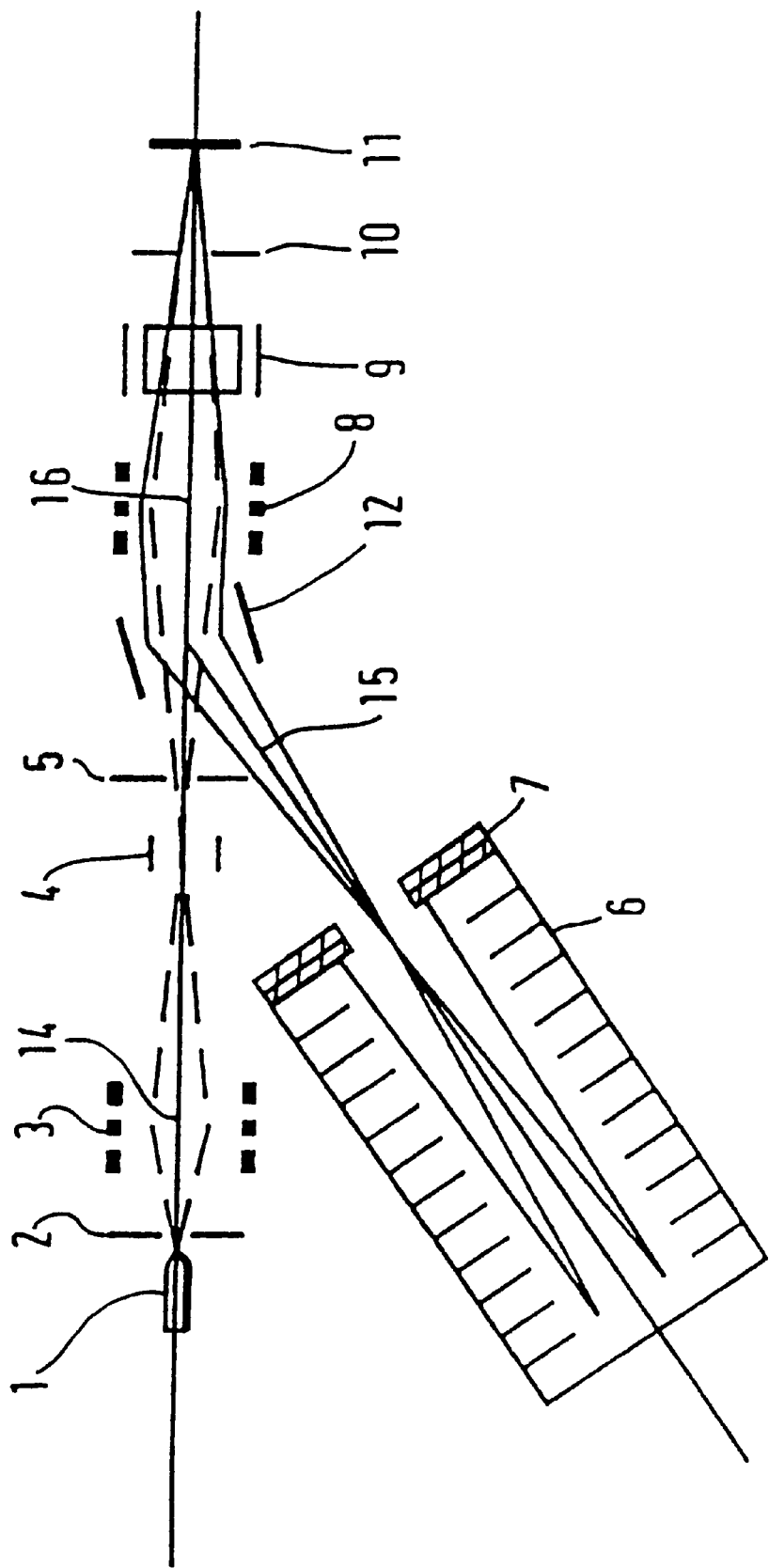
FIG. 4 is a schematic cross-section of a third embodiment of the present invention in which the secondary beam is deflected away from the mutual axis.

FIG. 4 is a schematic cross-section through a third embodiment of the present invention, in which the secondary beam axis 15 is offset from the axis 16 of the focuser 8 and the primary beam axis 14. In this case, the secondary beam is deflected away from the mutual axis by deflection plates 12.

Figure 5:
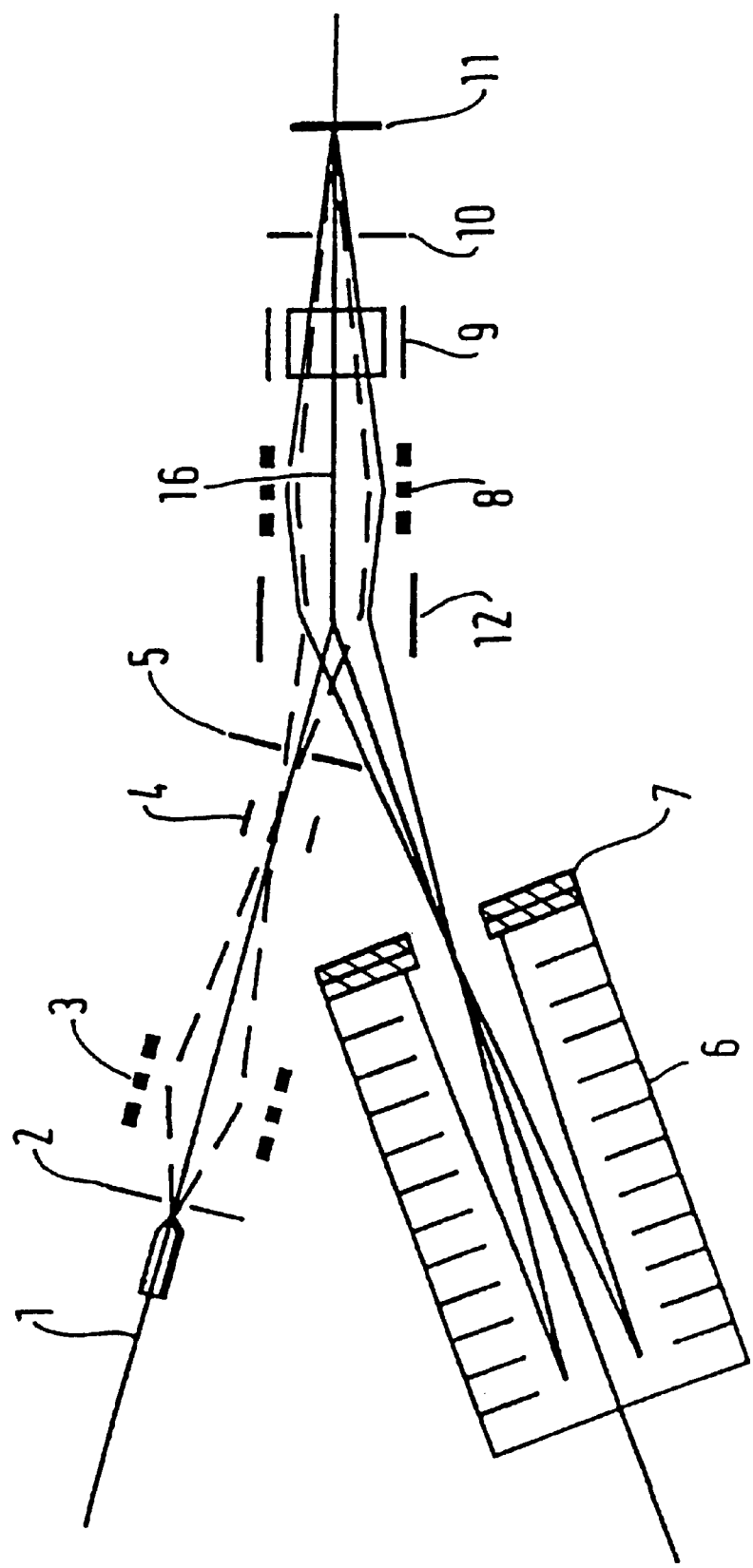
FIG. 5 is a schematic cross-section of a fourth embodiment of the present invention in which both beams are deflected into/out of the mutual axis; and, FIG. 6 is a schematic cross-section of a fifth embodiment of the present invention incorporating separate focusing electrodes for the primary and secondary beams.

FIG. 5 is a schematic cross-section through a 4th embodiment of the invention, in which both the primary and secondary ion beams are deflected into/out of the axis 16 of the focuser 8. In this case, the deflection plates 12 are switched between a first voltage for deflecting the primary beam into the axis 16, and a second voltage for deflecting the secondary ions away from the axis 16.

Figure 6:
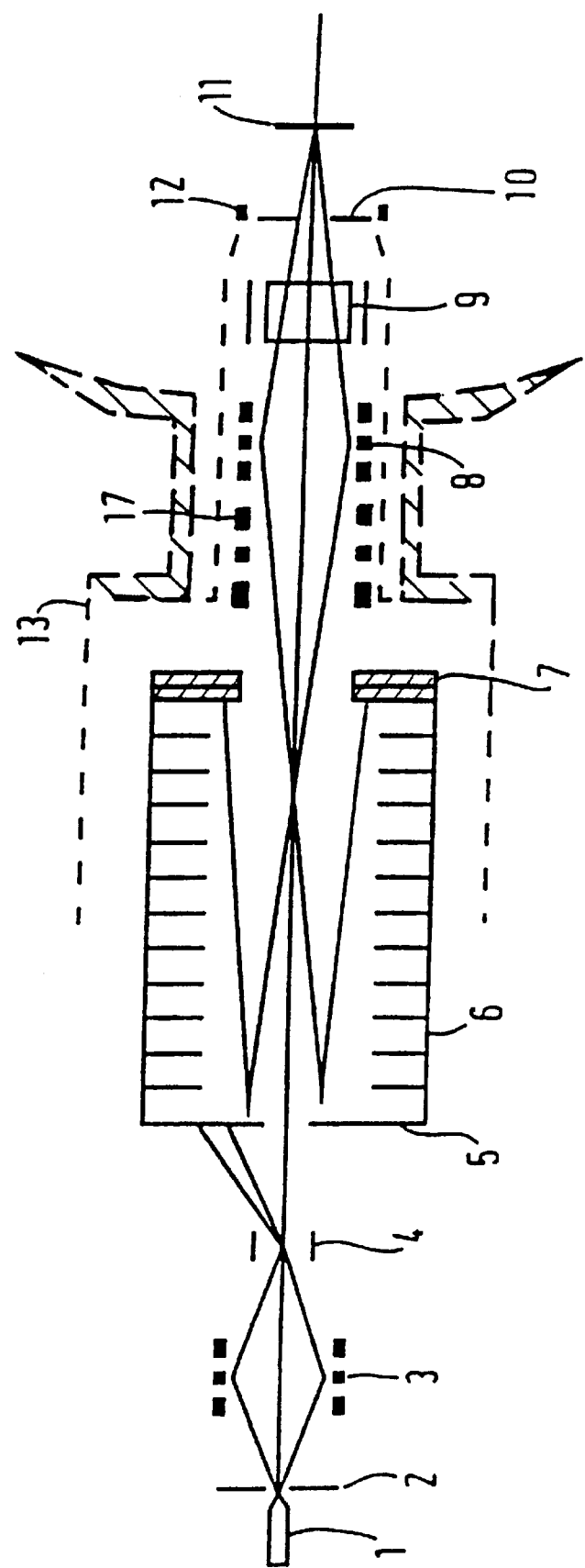

FIG. 6 is a cross-section through a 5th embodiment of the present invention. In this case, a second focuser 17 is provided for focusing the primary ion beam. The focuser is switched on to focus the incoming primary ion beam, and at this time the focuser 8 is switched off. The secondary ion beam focuser 8 is then switched on to focus the secondary ion beam with the primary ion beam focuser 17 being switched off. By arranging the two sets of electrodes 8, 17 in close proximity, the device can be easily fitted to a single flange 13. As can be seen both the primary and secondary beams pass through both sets of focusing electrodes 8, 17.

The devices of FIGS. 2–6 also comprise suitable electronic control means connected to the various components of the system to control the alternating voltages applied to the blanking electrodes 4, focusing electrodes 8, steering electrodes 9, deflector 12 etc. Further computer controlled data collecting means is also connected to he mass-spectrometer 6 to provide analysis of the sample. These items have been omitted from the Figures for purposes of clarity.

We claim:

1. A time-of-flight secondary ion mass spectrometer instrument comprising:
   (i) a pulsed source of charged particles for irradiating a sample with a primary beam of said charged particles;
   (ii) a time-of-flight mass spectrometer for analyzing a secondary beam of ions emitted from the sample in response to irradiation by said primary beam, said spectrometer producing an output spectrum responsive to the number of ions of differing mass emitted by said sample;
   (iii) focusing means through which the primary beam passes and is focused onto the samples and through which the secondary beam passes and is focused into the time-of-flight mass spectrometer; and
   (iv) means to switch the focusing means between a first condition for focusing the primary beam and a second condition for focusing the secondary beam.

2. A instrument according to claim 1 wherein the focusing means comprises a common focusing element.

3. A instrument according to claim 1 further comprising a steering element adapted to pulse synchronously with the primary beam and steer the primary beam across the sample in a raster pattern.

4. A instrument according to claim 1 wherein the primary beam passes through the mass spectrometer and is substantially coaxial with the secondary beam.

5. A instrument according to claim 1 wherein the mass spectrometer is disposed at an angle to the primary beam, the spectrometer further comprising means to deflect the primary and/or secondary beams, whereby the primary and secondary beams are substantially coaxial in the region of the focusing means.

6. A instrument according to claim 1 wherein the mass spectrometer comprises an ion mirror reflectron.

7. A instrument according to claim 1 further comprising means for generating and directing electrons onto the sample in order to charge neutralize the sample.

8. A instrument according to claim 1, further comprising means to apply a potential to the sample, and a collector to collect the secondary beam from the sample.

9. A instrument according to claim 8, wherein the potential applied to the sample or the collector or both is temporarily brought to zero to present a minimum deflecting field to the low energy electron beam.

10. A instrument according to claim 1, further comprising a single flange for fitting the analyzer to a vacuum chamber.

11. A instrument according to claim 1, further comprising a computer controlled data collecting means whereby a time of flight mass spectrum is collected at some or all raster points within an area of the sample.

12. A instrument according to claim 1, wherein the spectrometer is used in conjunction with means for post-ionization of material ejected from the sample surface.

13. A time-of-flight secondary ion mass spectrometer instrument comprising:
    (i) a pulsed source of charged particles for irradiating a sample with a primary beam of said charged particles;
    (ii) a time-of-flight mass spectrometer for analyzing a secondary beam of ions emitted from the sample in response to irradiation by said primary beam, said spectrometer producing an output spectrum responsive to the number of ions of differing mass emitted by said sample;
    (iii) a steering element which, in a first condition, steers the primary beam across the sample in a raster pattern and which, in a second condition, enables the secondary beam to enter the mass spectrometer; and
    (iv) means to switch the steering element between said first condition and said second condition.

14. A instrument according to claim 13, further comprising focusing means through which the primary beam passes and is focused onto the sample and through which the secondary beam passes and is focused into the time-of-flight mass spectrometer.

* * * * *